United States Patent

Hwang

[11] Patent Number: 5,665,495
[45] Date of Patent: Sep. 9, 1997

[54] METHOD FOR FABRICATING A SEMICONDUCTOR WITH A PHOTOMASK

[75] Inventor: Joon Hwang, Bubaleub, Rep. of Korea

[73] Assignee: Hyundai Electronics Industries Co., Ltd., Rep. of Korea

[21] Appl. No.: 399,930

[22] Filed: Mar. 7, 1995

[30] Foreign Application Priority Data

Mar. 10, 1994 [KR] Rep. of Korea ............ 1994-4719

[51] Int. Cl.$^6$ ............................................. G03F 9/00
[52] U.S. Cl. ...................................... 430/5; 430/22
[58] Field of Search ............... 430/5, 22; 356/399, 356/401; 437/229

[56] References Cited

U.S. PATENT DOCUMENTS 5,017,514   5/1991  Nashimoto .................. 430/311
5,262,258  11/1993  Yanagisawa ................. 430/311
5,498,500   3/1996  Bae ........................... 430/22

FOREIGN PATENT DOCUMENTS 3-12916   1/1991  Japan ............................ 430/5

*Primary Examiner*—S. Rosasco
*Attorney, Agent, or Firm*—Merchant, Gould, Smith, Edell, Welter & Schmidt, P.A.

[57] ABSTRACT

A photomask is fabricated by forming a scribe line at the four sides of a product die pattern and forming vernier patterns at four corners. The vernier pattern is formed of a regular square area and a regular square band-shaped area. A reticle rotation error of an exposer, X and Y-axis stepping error, a bending error of the lens and a pattern error formed on the wafer due to the fabricating error of the photomask can be found by developing the overlapped vernier patterns which are exposed several times using the photomask.

2 Claims, 2 Drawing Sheets

METHOD FOR FABRICATING A SEMICONDUCTOR WITH A PHOTOMASK

BACKGROUND OF THE INVENTION

The present invention relates to a method for fabricating a photomask, and more particularly to a method for fabricating a photomask capable of easily measuring whole errors of an error of an exposer and a fabricating error of a photomask, by forming scribe lines at each side of a product die pattern, forming a predetermined shape of a pattern in the respective corners, and measuring errors caused by respective exposure patterns.

In a conventional fabricating process of the photomask, a photomask pattern is fabricated by forming scribe lines 2 in the bottom side and the right side using a product die pattern 4 as shown in FIG. 1. However, there are problems with the prior art method using such a photomask in that it can not accurately measure a reticle rotation error of the exposer caused by misalignment among many patterns, a stepping error of X-axis and Y-axis, a bending error of the lens, or a pattern error formed on a wafer due to a fabricating error of the photomask.

SUMMARY OF THE INVENTION

An object of the present invention therefore is to provide a method for fabricating a semiconductor using a photomask capable of easily measuring an error of the exposer and a fabricating error of the photomask by forming scribe lines at four sides of a product die pattern, and forming a predetermined shape of a pattern at the respective four corners of the die pattern.

To achieve the above object, there is provided a method for fabricating a semiconductor with a photomask, comprising the steps of: forming a scribe line at four sides of a product die pattern; and forming vernier patterns at the four corners of the four sides thereby enabling a measurement of an error of an exposer and a fabricating error of the photomask by developing overlapped vernier patterns which are exposed several times using the photomask.

BRIEF DESCRIPTION OF THE DRAWINGS

Other objects, features and characters of the present invention as well as the functions of interrelated parts, will become apparent to a person of ordinary skill in the art from a study of the following detailed description, appended claims, and attached drawings, all of which form a part of this application. In the drawings:

DETAILED DESCRIPTION OF THE PREFERRED EMBODIMENT

The preferred embodiment according to the present invention will be described hereinbelow with reference to the drawings.

Figure 1:
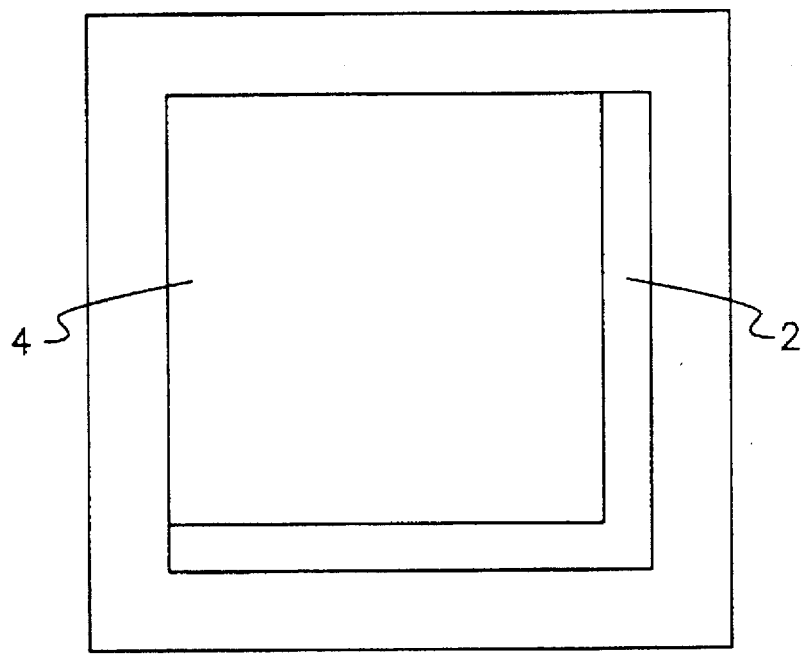
FIG. 1 is a plan view showing a conventional photomask including a product die and scribe lines.
Figure 2:
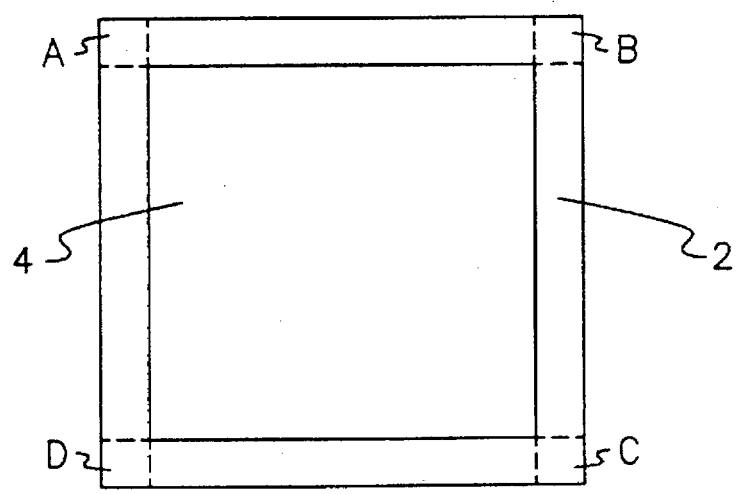
FIG. 2 is a plan view showing a photomask having scribe lines formed at four sides according to the present invention.
Figure 3:
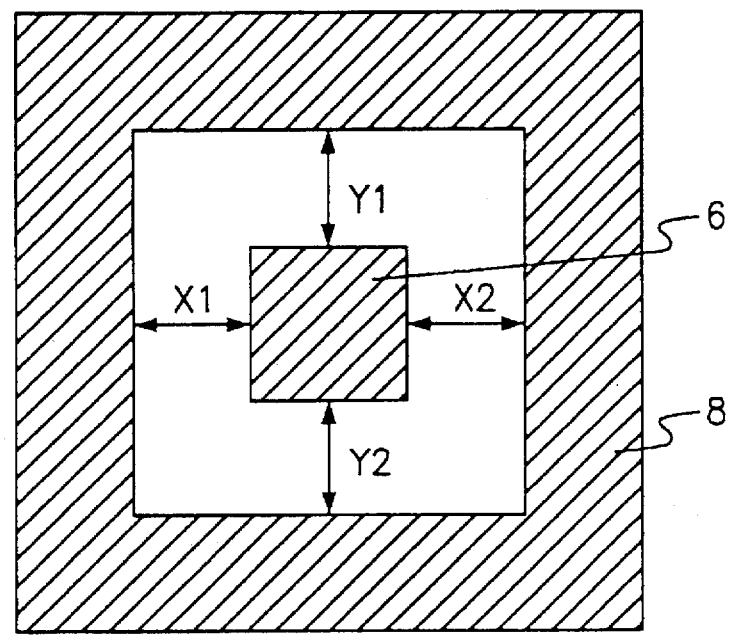
FIG. 3 is a plan view showing a pattern at the respective corners of the photomask according to the present invention.
Figure 4:
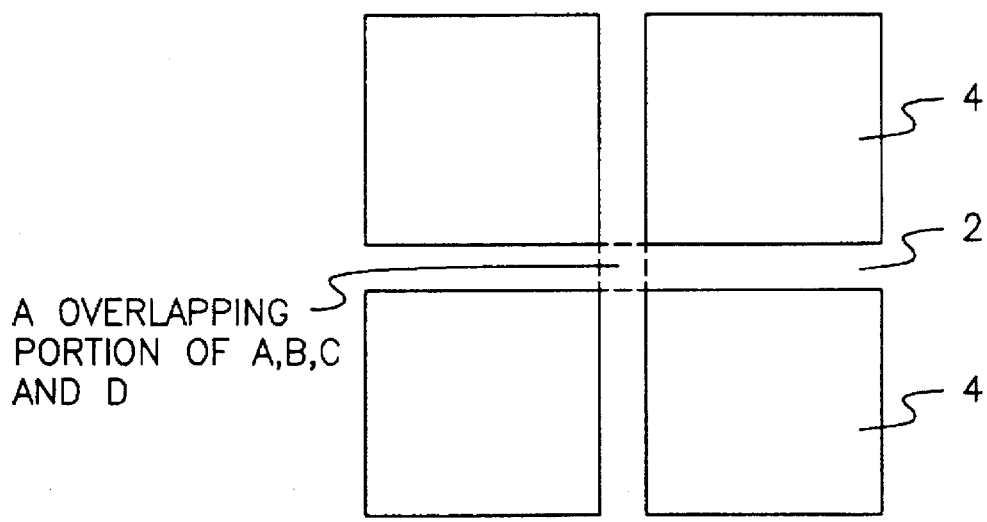
FIG. 4 is a plan view showing an exposed pattern formed on a semiconductor substrate by means of the photomask of the present invention.

FIG. 2 is a plan view showing a photomask having scribe lines formed at four sides according to the present invention, FIG. 3 is a plan view showing a vernier pattern at the respective corners of the photomask according to the present invention, and FIG. 4 is a plan view showing an exposed pattern formed on a semiconductor substrate by means of the photomask of the present invention.

In the drawings, reference numeral 2 is a scribe line and 4 is a product die pattern.

As shown in FIG. 2, in the photomask, the scribe line 2 is formed at four sides of the product die pattern 4 and, as shown in FIG. 3, vernier patterns having the same shape are formed at the respective four corners using chromium. Each of the vernier patterns is comprised of a regular square area 6 and a regular square band-shaped area 8. Hatched areas indicate a portion on which chromium is coated.

After preparing the photomask as the above, the exposure is performed to form a pattern on a semiconductor wafer by stepping the exposer on which the photomask is mounted as shown in FIG. 4.

To repeat a step exposure with an equal pitch in the row and column directions with the scribe line 2 overlapped with each other, the vernier patterns A,B,C and D formed in the respective corners are overlapped.

Thereafter a reticle rotation error of the exposer, X and Y-axis stepping error, a bending error of the lens mounted in the exposer, and a pattern error formed on the wafer due to the fabricating error of the photomask can be found by measuring lengths $x_1$, $x_2$, $Y_1$, and $y_2$ between the square area 6 and the square band-shaped area 8 after developing the wafer.

As shown in FIG. 4, the vernier patterns A,B,C and D are overlapped and exposed at one portion, respectively. In this case, the respective exposed patterns are exposed with respective error elements. Therefore, the error elements are found after development of the wafer. Further, since each of the vernier patterns A to D is formed at the corners of the product die 4, the biggest error element can be found.

As mentioned above in detail, since the photomask of the present invention is fabricated by forming the scribe line at four sides of product die pattern and forming the vernier pattern in the four corners, the reticle rotation error of the exposer, X and Y-axis stepping error, the bending error of the lens and the pattern error formed on the wafer due to the fabricating error of the photomask can be found.

This invention has been described in connection with what is presently considered to be the most practical and preferred embodiment. However, the invention is not intended to be limited to the disclosure. Rather, the disclosure is intended to cover all modifications and equivalent arrangements included within the spirit and scope of the appended claims.

What is claimed is:

1. A method for fabricating a semiconductor with scribe lines using a photomask having vernier patterns in scribe line areas, comprising the steps of:

providing the photomask with said vernier patterns in each corner of four sides of said scribe line areas;

exposing the photomask and overlapping during the exposing the vernier patterns to form an overlapped exposed pattern in a portion of the scribe lines on the semiconductor; and measuring the overlapped exposed pattern to inspect errors.

2. The method in accordance with claim 1, wherein each of the vernier patterns comprises a regular square area and spaced therefrom a regular square band-shaped area surrounding the regular square area.

* * * * *